(12) United States Patent
Yamamoto et al.

(10) Patent No.: US 9,041,442 B2
(45) Date of Patent: May 26, 2015

(54) SEMICONDUCTOR DEVICE AND METHOD FOR DRIVING THE SAME

(71) Applicant: Semiconductor Energy Laboratory Co., Ltd., Atsugi-shi, Kanagawa-ken (JP)

(72) Inventors: Roh Yamamoto, Kanagawa (JP); Kazunori Watanabe, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 25 days.

(21) Appl. No.: 13/888,454

(22) Filed: May 7, 2013

(65) Prior Publication Data

US 2013/0300468 A1 Nov. 14, 2013

(30) Foreign Application Priority Data

May 9, 2012 (JP) ................. 2012-107343

(51) Int. Cl.
*H03L 7/06* (2006.01)
*H03K 17/00* (2006.01)
*G06G 7/186* (2006.01)

(52) U.S. Cl.
CPC .............. *H03K 17/002* (2013.01); *G06G 7/186* (2013.01)

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Lincoln Donovan
*Assistant Examiner* — Khareem E Almo
(74) *Attorney, Agent, or Firm* — Fish & Richardson P.C.

(57) ABSTRACT

A semiconductor device including an integrator circuit, in which electric discharge from a capacitor can be reduced to shorten time required for charging the capacitor in the case where supply of power supply voltage is stopped and restarted, and a method for driving the semiconductor device are provided. One embodiment has a structure in which a transistor with small off-state current is electrically connected in series to a capacitor in an integrator circuit. Further, in one embodiment of the present invention, a transistor with small off-state current is electrically connected in series to a capacitor in an integrator circuit; the transistor is on in a period during which power supply voltage is supplied; and the transistor is off in a period during which supply of the power supply voltage is stopped.

20 Claims, 11 Drawing Sheets

(56) References Cited

U.S. PATENT DOCUMENTS

| | | | |
|---|---|---|---|
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,466,175 B2 * | 12/2008 | Smith et al. | 327/156 |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,248,172 B2 * | 8/2012 | Okada et al. | 331/57 |
| 8,426,853 B2 | 4/2013 | Saito et al. | |
| 8,432,718 B2 | 4/2013 | Saito | |
| 8,493,114 B2 * | 7/2013 | Cho et al. | 327/156 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0066446 A1 * | 3/2009 | Sahu et al. | 333/172 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0095275 A1 | 4/2011 | Ito | |
| 2012/0038618 A1 | 2/2012 | Koyama | |
| 2012/0049901 A1 | 3/2012 | Takewaki et al. | |
| 2013/0093478 A1 * | 4/2013 | Wong | 327/156 |
| 2013/0300468 A1 * | 11/2013 | Yamamoto et al. | 327/156 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-125253 A | 5/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

(56) References Cited

OTHER PUBLICATIONS

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YBFe2O4, and YB2Fe3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Veno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR DEVICE AND METHOD FOR DRIVING THE SAME

BACKGROUND OF THE INVENTION

1. Field of the Invention

The present invention relates to a semiconductor device which functions as an integrator circuit and a method for driving the semiconductor device. In particular, the present invention relates to a semiconductor device in which electric charge accumulated in a capacitor of an integrator circuit can be held even when a power source is turned off and a method for driving the semiconductor device.

In this specification, a semiconductor device refers to a device including a semiconductor element. Therefore, integrator circuits which are to be described in this specification are semiconductor devices.

2. Description of the Related Art

An integrator circuit including a differential amplifier circuit (also referred to as an operational amplifier) is known as a circuit which is used for a loop filter or the like in a phase locked loop circuit (PLL circuit).

A basic circuit configuration of the integrator circuit is disclosed in Patent Document 1.

REFERENCE

Patent Document

Patent Document 1: Japanese Published Patent Application No. H6-125253

SUMMARY OF THE INVENTION

In general, an integrator circuit including a differential amplifier circuit is operated by being continuously supplied with power supply voltage. Therefore, the power supply voltage is supplied even in a non-operation period during which supply of the power supply voltage is not needed. In view of a reduction in power consumption, it is preferable that the power supply voltage be supplied in an operation period and be not supplied in a non-operation period.

However, in the conventional integrator circuit, when supply of power supply voltage is stopped, electric charge held in a capacitor is discharged. Therefore, additional charge of electric charge is needed at the time of restarting supply of the power supply voltage.

As described above, in the structure in which supply of power supply voltage to the integrator circuit is stopped and restarted, it takes time to charge and discharge the capacitor, which causes a problem in the case where high-speed operation is required.

In view of the above problem, an object of one embodiment of the present invention is to provide a semiconductor device including an integrator circuit, in which electric discharge from a capacitor can be reduced to shorten time required for charging the capacitor in the case where supply of power supply voltage is stopped and restarted, and a method for driving the semiconductor device.

One embodiment of the present invention has a structure in which a transistor with small off-state current is electrically connected in series to a capacitor in an integrator circuit. In one embodiment of the present invention, a transistor with small off-state current is electrically connected in series to a capacitor in an integrator circuit; the transistor is on in a period during which power supply voltage is supplied; and the transistor is off in a period during which supply of the power supply voltage is stopped.

One embodiment of the present invention is a semiconductor device including an integrator circuit including a differential amplifier circuit, a resistor, a capacitor, and a transistor. In the semiconductor device, an off-state current per channel width of the transistor is less than or equal to $1 \times 10^{-22}$ A/μm, and the capacitor is provided between an inverting input terminal and an output terminal of the differential amplifier circuit and connected to an electrode serving as a source or a drain of the transistor.

In one embodiment of the present invention, it is preferable that the transistor be provided between the capacitor and the output terminal of the differential amplifier circuit in the semiconductor device.

In one embodiment of the present invention, it is preferable that the transistor be provided between the capacitor and the inverting input terminal of the differential amplifier circuit in the semiconductor device.

In one embodiment of the present invention, it is preferable that a semiconductor layer of the transistor be formed of an oxide semiconductor in the semiconductor device.

In one embodiment of the present invention, it is preferable that a back gate electrode be provided on a back channel side of the semiconductor layer in the semiconductor device.

One embodiment of the present invention is a method for driving a semiconductor device, including the steps of turning off a transistor that is provided between an inverting input terminal and an output terminal of a differential amplifier circuit of an integrator circuit in a period during which supply of power supply voltage is stopped, and turning on the transistor in a period during which supply of the power supply voltage is performed.

One embodiment of the present invention is a method for driving a semiconductor device, including the steps of turning off a transistor that is provided between an inverting input terminal and an output terminal of a differential amplifier circuit before the supply of power supply voltage is stopped, and stopping supply of power supply voltage; and turning on the transistor after supply of the power supply voltage is restarted.

In the above-described embodiment, with the use of the transistor with small off-state current, electric discharge at the time of stopping supply of the power supply voltage can be prevented, and quick charge of a capacitor can be performed at the time of restarting supply of the power supply voltage. Therefore, in one embodiment of the present invention, in the case where supply of power supply voltage is stopped and restarted, electric discharge from a capacitor can be reduced, so that time required for charging the capacitor can be shortened.

DETAILED DESCRIPTION OF THE INVENTION

Figure 1:
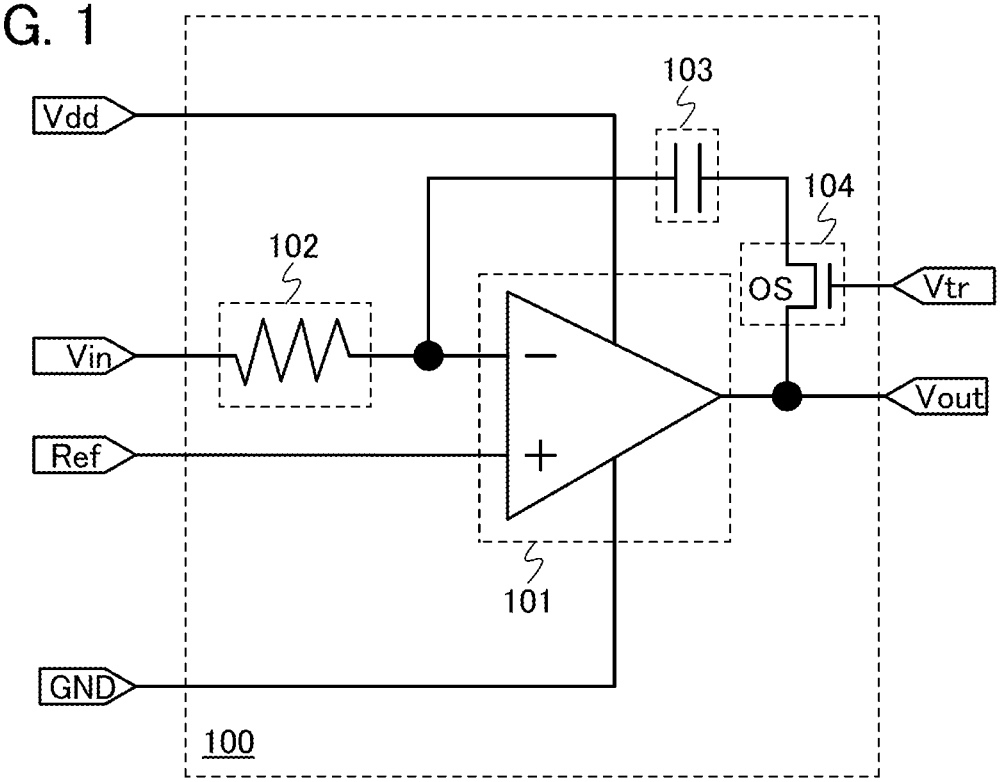
FIG. 1 is a circuit diagram of an integrator circuit.

Hereinafter, embodiments of the present invention will be described with reference to the accompanying drawings. However, the present invention can be carried out in many different modes, and those skilled in the art could appreciate that a variety of modifications can be made to the embodiment and details of the present invention without departing from the spirit and scope of the present invention. Thus, the present invention should not be interpreted as being limited to the description of the embodiments. Note that identical portions or portions having the same function in all drawings illustrating the structure of the invention that are described below are denoted by the same reference numerals.

Note that, the size, layer thickness, and signal waveform of each object shown in the drawings and the like in the embodiments are exaggerated for simplicity in some cases. Therefore, embodiments of the present invention are not limited to such scales.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" includes a case in which a plurality of "electrodes" or "wirings" is formed in an integrated manner.

(Embodiment 1)

In this embodiment, a circuit configuration of an integrator circuit that is a semiconductor device and a driving method of the integrator circuit will be described.

An integrator circuit 100 illustrated in FIG. 1 includes a differential amplifier circuit 101, a resistor 102, a capacitor 103, and a transistor 104.

The differential amplifier circuit 101 is supplied with power supply voltage by a high power supply potential Vdd and a ground potential GND. Note that the ground potential may be a low power supply potential Vss. The potential of a wiring which is supplied with the high power supply potential Vdd is changed from the high power supply potential Vdd to the ground potential GND, whereby supply of the power supply voltage to the differential amplifier circuit 101 is stopped. Further, the potential of the wiring supplied with the high power supply potential Vdd is set from the ground potential GND to the high power supply potential Vdd, whereby supply of the power supply voltage to the differential amplifier circuit 101 is restarted.

With the structure in which a stop and a restart of supply of the power supply voltage to the differential amplifier circuit 101 are performed, power consumption in a period during which supply of the power supply voltage is stopped can be reduced.

A non-inverting input terminal of the differential amplifier circuit 101 is connected to a terminal which is supplied with a reference voltage signal Ref. An inverting input terminal of the differential amplifier circuit 101 is connected to a terminal which is supplied with an input signal Vin, via the resistor 102. The inverting input terminal of the differential amplifier circuit 101 is connected to an output terminal of the differential amplifier circuit 101 via the capacitor 103 and the transistor 104. The output terminal of the differential amplifier circuit 101 is connected to a terminal which outputs an output signal Vout.

The reference voltage signal Ref is preferably a signal having an arbitrary constant voltage which is obtained by resistance voltage division or the like. For example, the reference voltage signal Ref may be ½ VDD which is ½ times the power supply voltage.

A signal having a square wave or a sine wave may be input as the input signal Vin. A signal having a shape obtained by integrating the input signal Vin may be output as the output signal Vout.

One terminal of the resistor 102 is connected to the terminal supplied with the input signal Vin, and the other terminal thereof is connected to the inverting input terminal of the differential amplifier circuit 101.

One electrode of the capacitor 103 is connected to the inverting input terminal of the differential amplifier circuit 101, and the other electrode thereof is connected to one of a source and a drain of the transistor 104.

Note that the resistor 102 and the capacitor 103 form a CR integrator circuit. Further, the transistor 104 is turned on (in a conduction state), whereby the integrator circuit 100 in FIG. 1 can have a configuration of an integrator circuit in which the capacitor 103 is provided between the output terminal and the inverting input terminal of the differential amplifier circuit 101.

Note that the capacitor 103 is connected to the one of the source and the drain of the transistor 104 and a current between the source and the drain of the transistor 104 flows to the capacitor 103. In this case, the capacitor and the transistor can be connected in series.

A gate of the transistor 104 is connected to a terminal which is supplied with a transistor control signal Vtr, the one of the source and the drain thereof is connected to the other electrode of the capacitor 103, and the other of the source and the drain thereof is connected to the output terminal of the differential amplifier circuit 101.

As the transistor control signal Vtr, a signal for making the transistor 104 on or off (in non-conduction state) may be supplied in response to a stop or a restart of supply of the power supply voltage.

Note that electric charge between the other electrode of the capacitor 103 and the one of the source and the drain of the transistor 104 can be held when the transistor 104 has an off-state current per channel width of $1 \times 10^{-22}$ A/μm or less, that is extremely smaller than an off-state current of a transistor having a semiconductor layer including silicon.

Note that "off-state current" is a current which flows between a source and a drain when a transistor is in an off state. In the case of an n-channel transistor (whose threshold voltage is, for example, about 0 to 2 V), off-state current refers to a current flowing between the source and the drain when negative voltage is applied between the gate and the source.

In this embodiment, for a structure in which the off-state current per channel width of the transistor is extremely reduced to $1 \times 10^{-22}$ A/μm or less, it is preferable to use a transistor in which a channel is formed in an oxide semiconductor layer. In drawings, "OS" is written in order to indicate that the transistor 104 is a transistor in which a channel is formed in an oxide semiconductor layer.

A material which can achieve off-state current characteristics equivalent to those of the oxide semiconductor material may be used instead of the oxide semiconductor material. For example, a wide gap material like silicon carbide (more specifically, a semiconductor material whose energy gap Eg is larger than 3 eV) can be used. Alternatively, a MEMS switch or the like may be used instead of a transistor to break connection between wirings, which achieves long-time holding of electric charge.

Note that a transistor which is included in the differential amplifier circuit 101 other than the transistor 104 in FIG. 1 can include a semiconductor layer different from that of the transistor 104. For example, the transistor included in the differential amplifier circuit 101 may be a transistor in which a channel is formed in a silicon layer or a silicon substrate.

Here, an oxide semiconductor used for the semiconductor layer of the transistor 104 is described in detail.

At least indium (In) or zinc (Zn) is preferably contained as an oxide semiconductor used for the semiconductor layer of the transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, the following can be used: a four-component metal oxide such as an In—Sn—Ga—Zn-based oxide; a three-component metal oxide such as an In—Ga—Zn-based oxide, an In—Sn—Zn-based oxide, an In—Zr—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; or a one-component metal oxide such as an In-based oxide, a Sn-based oxide, or a Zn-based oxide.

Note that here, for example, an In—Ga—Zn-based oxide refers to an oxide mainly containing In, Ga, and Zn, and there is no limitation on the ratio of In to Ga and Zn.

Alternatively, a material represented by $InMO_3(ZnO)_m$ (m>0) may be used as the oxide semiconductor. Note that M represents one or more metal elements selected from Ga, Fe, Mn, and Co. Still alternatively, a material represented by $In_2SnO_5(ZnO)_n$ (n>0) may be used as the oxide semiconductor.

For example, an In—Ga—Zn-based oxide with an atomic ratio of In:Ga:Zn=3:1:2, 1:1:1, or 2:2:1, or an oxide whose atomic ratio is in the neighborhood of the above atomic ratios can be used. Alternatively, an In—Sn—Zn-based oxide with an atomic ratio of In:Sn:Zn=1:1:1, 2:1:3, or 2:1:5, or an oxide with whose atomic ratio is in the neighborhood of the above atomic ratios may be used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy Formula (1).

$$(a-A)^2+(b-B)^2+(c-C)^2 \le r^2 \quad (1)$$

For example, r may be 0.05. The same applies to other oxides.

However, the composition of the oxide semiconductor is not limited to those described above, and an oxide semiconductor having an appropriate composition may be used depending on necessary semiconductor characteristics (e.g., field-effect mobility or threshold voltage). In order to obtain the required semiconductor characteristics, it is preferable that the carrier concentration, the impurity concentration, the defect density, the atomic ratio between a metal element and oxygen, the interatomic distance, the density, and the like be set to appropriate values.

When an oxide semiconductor is highly purified, the off-state current of a transistor using such an oxide semiconductor for a semiconductor layer can be sufficiently reduced (here, the off-state current means a drain current when a potential difference between a source and a gate is equal to or lower than the threshold voltage in the off state, for example). A highly purified oxide semiconductor can be obtained, for example, in such a manner that a film is deposited while heating is performed so as to prevent hydrogen and a hydroxyl group from being contained in the oxide semiconductor, or heat treatment is performed after film deposition so as to remove hydrogen and a hydroxyl group from the film.

Figure 2:
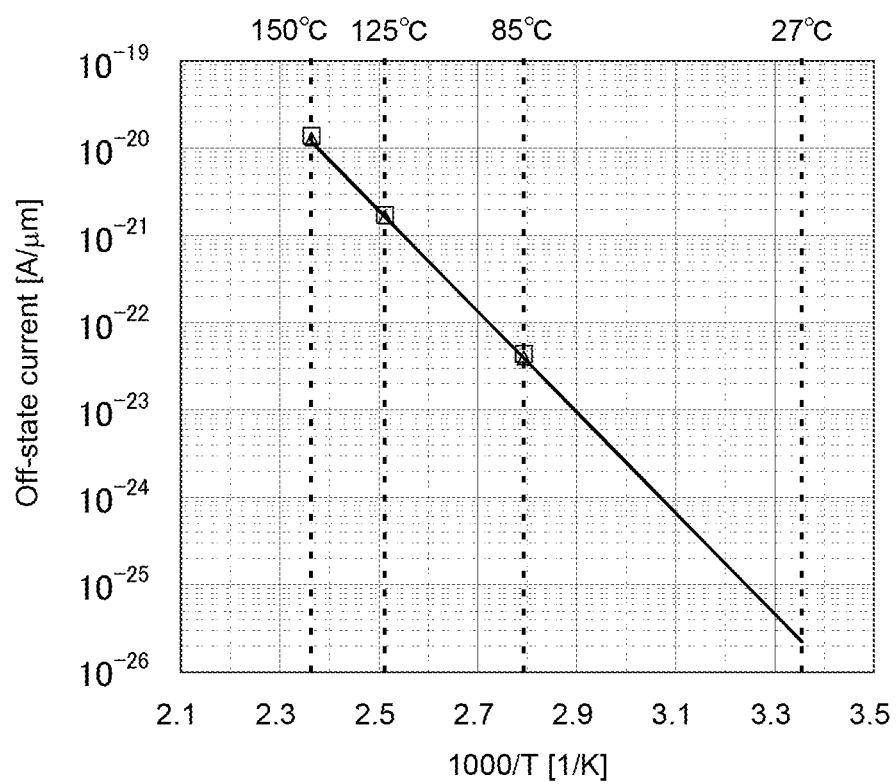
FIG. 2 is an Arrhenius plot diagram for showing off-state current.

In order to detect extremely low off-state current due to the use of a highly purified oxide semiconductor, a relatively large transistor is fabricated to measure the off-state current, whereby an off-state current that actually flows can be estimated. FIG. 2 shows an Arrhenius plot of the off-state current per channel width W of 1 μm of a large transistor having a channel width W of 1 m (1000000 μm) and a channel length L of 3 μm when the temperature changes to 150° C., 125° C., 85° C., and 27° C. As seen from FIG. 2, it is found that the off-state current at 27° C. is as extremely small as $3 \times 10^{-26}$ A/μm. The reason the off-state current is measured at elevated temperature is that a very low current at room temperature cannot be measured.

In the case where a highly purified In—Ga—Zn-based-oxide semiconductor is used for a channel region of a transistor having a channel length of 10 μm, a semiconductor film thickness of 30 nm, and a drain voltage of about 1 V to 10 V, the off-state current of the transistor can be reduced to $1 \times 10^{-13}$ A or less. In addition, the off-state current per channel width (the value obtained by dividing the off-state current by the channel width of the transistor) can be made about $1 \times 10^{-23}$ A/μm (10 yA/μm) to $1 \times 10^{-22}$ A/μm (100 yA/μm).

The above is the description of the oxide semiconductor used for the semiconductor layer of the transistor 104.

Figure 3A:
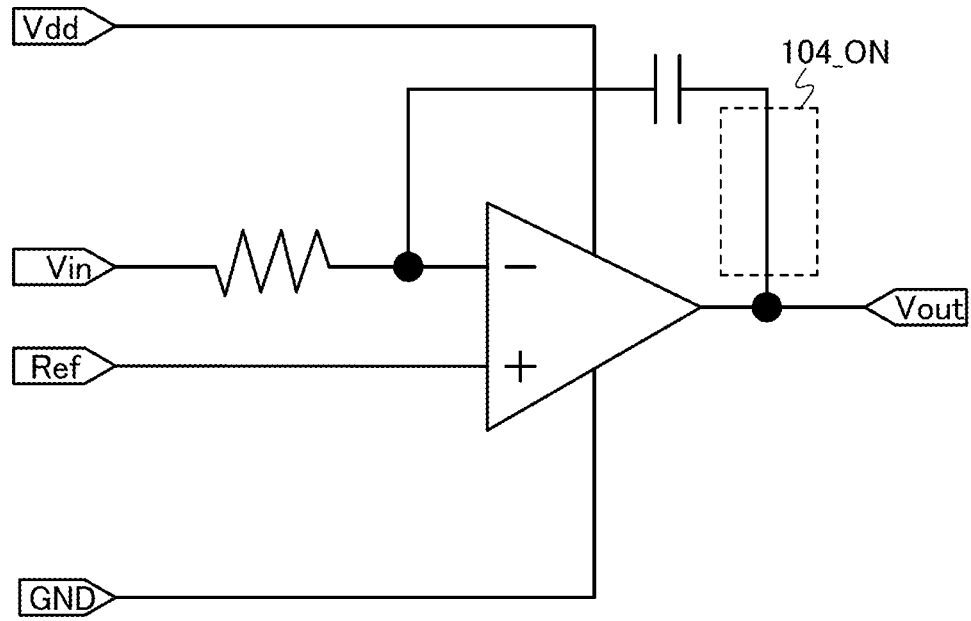
FIGS. 3A and 3B are each a circuit diagram of an integrator circuit.

In the case where the transistor 104 has an off-state current per width of $1 \times 10^{-22}$ A/μm or less, which is extremely smaller than the off-state current of a transistor having a semiconductor layer including silicon, when the transistor 104 is on, an integrator circuit configuration illustrated in FIG. 3A is obtained. Specifically, turning on the transistor 104 can lead to a state where the other electrode of the capacitor 103 is electrically connected to the output terminal of the differential amplifier circuit 101 (a dashed line 104_ON in FIG. 3A). Further, turning off the transistor 104 can lead to a state where the other electrode of the capacitor 103 is not electrically connected to the output terminal of the differential amplifier circuit 101 (a dashed line 104_OFF in FIG. 3B).

Figure 3B:
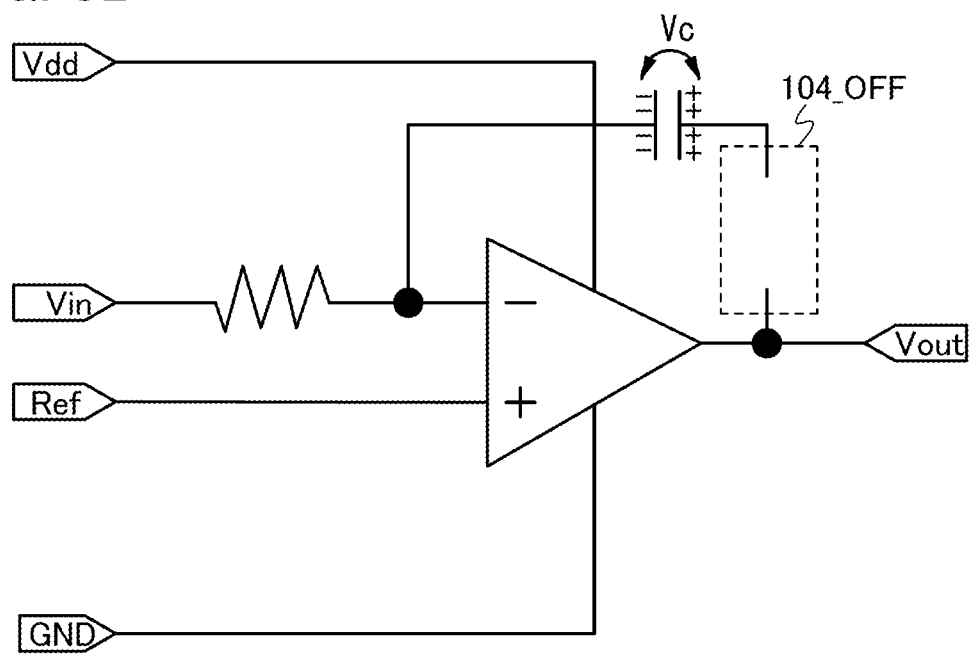

When the other electrode of the capacitor 103 is not electrically connected to the output terminal of the differential amplifier circuit 101 as illustrated in FIG. 3B, electric charge can be held in both the electrodes of the capacitor 103. A voltage Vc of the electric charge held in both the electrodes of the capacitor 103 corresponds to an integral value in the integrator circuit. Since the off-state current of the transistor 104 is extremely small, the integral value can be held for a certain period even supply of the power supply voltage is stopped.

Figure 4:
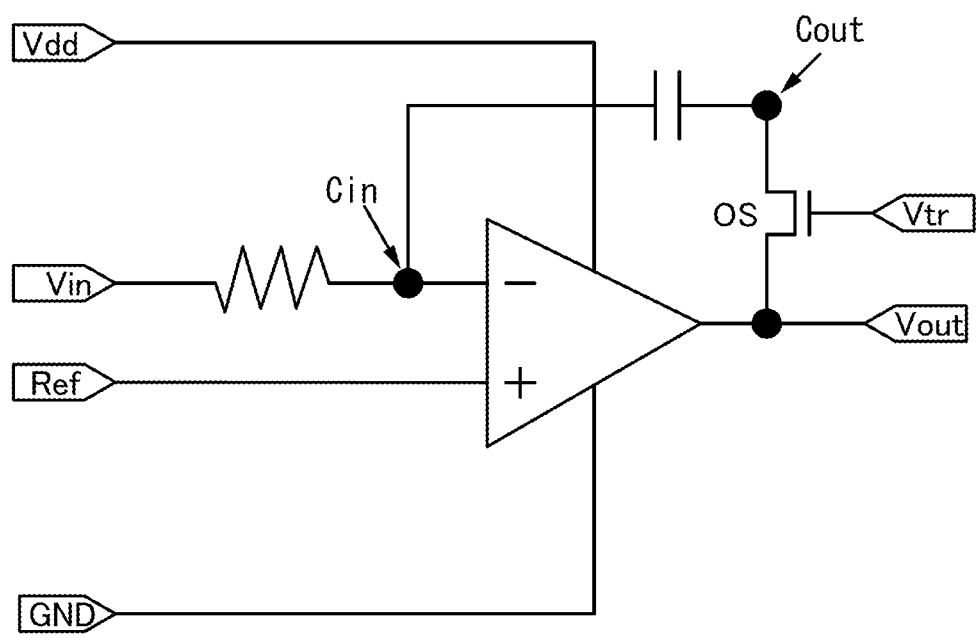
FIG. 4 is a circuit diagram of an integrator circuit.

Next, a normal operation of the integrator circuit 100 and operations thereof at the time of stopping and restarting supply of the power supply voltage are described. For description of the operations, nodes of the integrator circuit 100 in FIG. 1 are denoted by the reference numerals in FIG. 4. In FIG. 4, a node which is electrically connected to the one electrode of the capacitor 103 is referred to as a node Cin, and a node which is electrically connected to the other electrode of the capacitor 103 is referred to as a node Cout.

Figure 5:
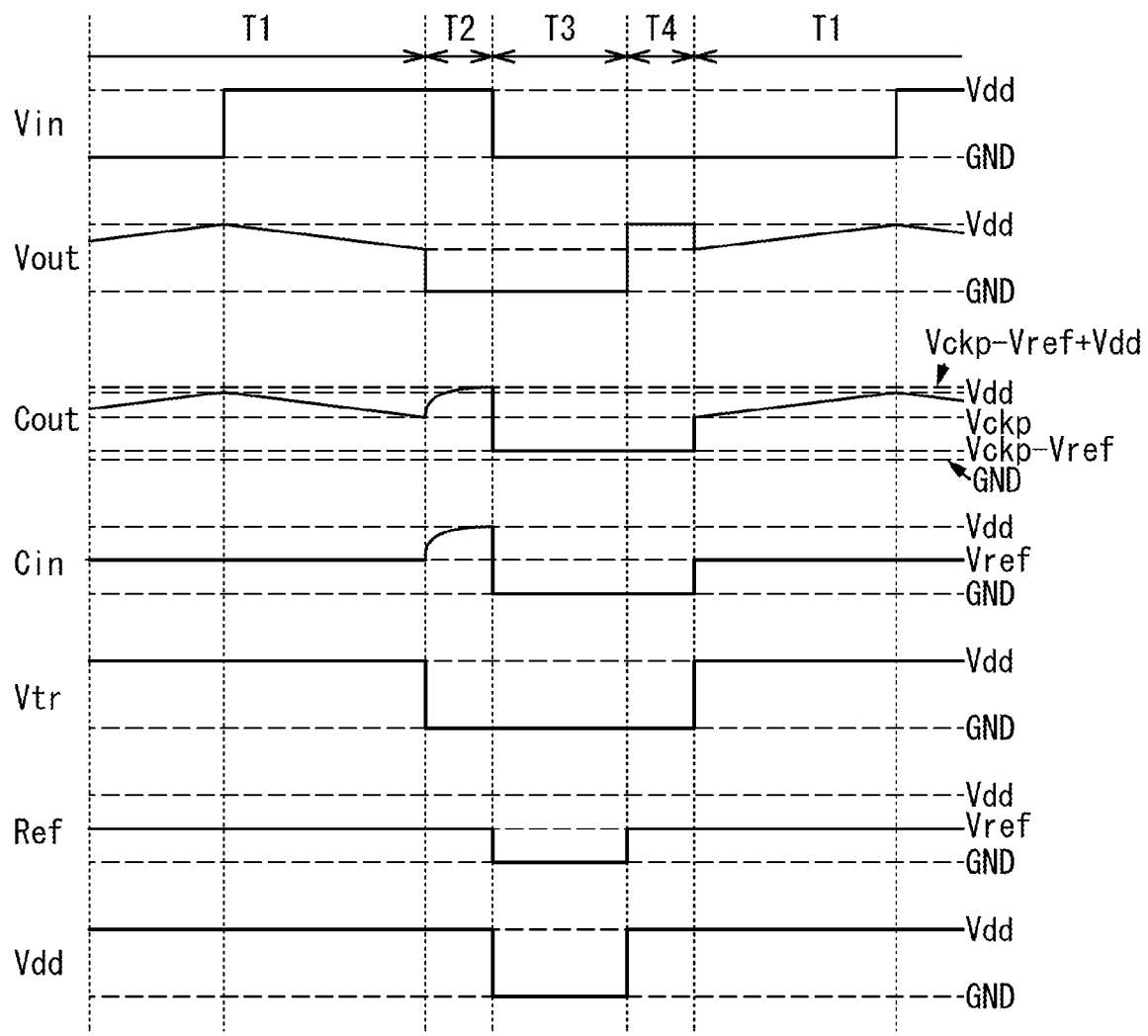
FIG. 5 is a timing chart of an integrator circuit.

Together with FIG. 4, FIG. 5 is a timing chart that shows changes in the input signal Vin, the output signal Vout, the potential of the node Cout, the potential of the node Cin, the transistor control signal Vtr, the reference voltage signal Ref, and the potential of the wiring supplied with the high power supply potential Vdd. The timing chart in FIG. 5 shows the following separate periods: a period T1 as a normal operation period; a period T2 as a period for preparing for a stop of power supply; a period T3 as a period for stopping power supply; a period T4 as a period for preparing for a restart of power supply.

Note that in the description for the operations using FIG. 4 and FIG. 5, the transistor is an n-channel transistor. Further, every signal has a potential between the two potentials, the high power supply potential Vdd and the ground potential GND. Note that a signal which is based on the high power supply potential Vdd is also referred to as an H signal and a signal which is based on the ground potential GND is also referred to as an L signal. Further, in the description, supply of the power supply voltage is stopped by changing the high power supply potential Vdd to the ground potential GND.

The operation in the period T1 in FIG. 5 is described.

In the period T1, the integrator circuit 100 outputs the output signal Vout which has a waveform obtained by integrating the H signal or the L signal of the input signal Vin. Specifically, the integrator circuit 100 outputs, as the output signal Vout, a triangle wave which shows repeated rise and drop of the potential in response to the H signal or the L signal of the input signal Vin.

Further, in the period T1, the potential of the reference voltage signal Ref is a reference voltage Vref. The wiring supplied with the high power supply potential Vdd is at the high power supply potential Vdd. Further, the transistor control signal Vtr is the H signal and the transistor 104 is on.

In addition, in the period T1, the potential of the node Cout is also changed in response to a change in the output signal Vout. Since virtual short circuit with the reference voltage signal Ref occurs, the potential of the node Cin becomes the potential Vref.

Next, the operation in the period T2 in FIG. 5 is described.

In the period T2, before supply of the power supply voltage is stopped, the integrator circuit 100 is operated to hold the voltage of both the electrodes of the capacitor 103 which corresponds to the integral value.

In the period T2, the integrator circuit 100 stops outputting the output signal Vout having the waveform obtained by integrating the input signal Vin. Specifically, as shown in FIG. 5, the input signal Vin is fixed to the high power supply potential Vdd that is the potential of the input signal Vin in the period T1. In the period T2, negative feedback does not occur, and thus the differential amplifier circuit 101 simply performs differential amplification. Therefore, for example in FIG. 5, the output signal Vout is the ground potential GND. Note that by contrast with the waveforms in the period T2 shown in FIG. 5, the input signal Vin may be fixed to the ground potential GND, so that the output signal Vout may be the high power supply potential Vdd.

In addition, in the period T2, the potential of the reference voltage signal Ref is the reference voltage Vref. The wiring supplied with the high power supply potential Vdd is at the high power supply potential Vdd. Further, the transistor control signal Vtr is the L signal and the transistor 104 is off.

Further, in the period T2, the transistor 104 is off. In the integrator circuit of this embodiment, the transistor 104 which has small off-state current is used. Therefore, electric discharge can be prevented, and thus a voltage which is held in both the electrodes of the capacitor 103 (Vckp−Vref) can be held.

Note that Vckp is the potential of the node Cout at the time shortly before the transistor 104 is turned off when the node Cin is supplied with the reference voltage Vref as in the period T1. That is, by turning off the transistor 104, a voltage which is held in the capacitor 103 between the node Cin and the node Cout becomes a difference between the potential Vckp of the node Cout and the potential of the reference voltage Vref (Vckp−Vref).

In the period T2, the potential of the node Cin becomes equal to the potential of the input signal Vin owing to discharge of electric charge. Accordingly, the potential of the node Cin is changed from the potential Vref to the high power supply potential Vdd as shown in FIG. 5.

Although electric charge is not discharged, the potential of the node Cout is changed in response to the change in the potential of the node Cin owing to capacitive coupling in the capacitor 103. Specifically, as shown in the example in FIG. 5, the potential of the node Cout is changed from Vckp to (Vckp−Vref +Vdd).

Note that the voltage (Vckp−Vref), which is applied to both the electrodes of the capacitor 103 in the period T2, corresponds to an integral value which is held in both the electrodes of the capacitor 103.

Then, the operation in the period T3 in FIG. 5 is described.

In the period T3, supply of the power supply voltage to the integrator circuit 100 is stopped.

In the period T3, supply of the power supply voltage to the integrator circuit 100 is stopped, and both the input signal Vin and the output signal Vout are at the ground potential GND.

In addition, in the period T3, the potential of the reference voltage signal Ref becomes the ground potential GND in response to the stop of supply of the power supply voltage. The wiring supplied with the high power supply potential Vdd is at the ground potential GND. Further, the transistor control signal Vtr is the L signal, and the transistor 104 is off.

Further, in the period T3, the transistor 104 is off. In the integrator circuit of this embodiment, the transistor 104 which has small off-state current is used. Therefore, electric discharge can be prevented, and thus a voltage which is held in both the electrodes of the capacitor 103 (Vckp−Vref) can be held.

The potential of the node Cin in the period T3 is reduced to the ground potential GND in response to the stop of supply of the power supply voltage. Accordingly, the potential of the node Cout is lowered to be kept at (Vckp−Vref) owing to capacitive coupling.

Next, the operation in the period T4 in FIG. 5 is described.

In the period T4, supply of the power supply voltage to the integrator circuit 100 is restarted and the integrator circuit 100 is operated to change each potential back to the potential in the normal operation state before the input signal Vin is input.

In the period T4, supply of the power supply voltage to the integrator circuit 100 is restarted and the integrator circuit 100 outputs the output signal Vout in accordance with a change in the input signal Vin. Specifically, as shown in FIG. 5, the input signal Vin is fixed to the ground potential GND. In the period T4, negative feedback does not occur, and thus the differential amplifier circuit 101 simply performs differential amplification. Therefore, for example in FIG. 5, the output signal Vout is the high power supply potential Vdd. Note that by contrast with the waveforms in the period T4 shown in FIG. 5, the input signal Vin may be fixed to the high power supply potential Vdd, so that the output signal Vout may be the ground potential GND.

In addition, in the period T4, the potential of the reference voltage signal Ref is the reference voltage Vref. The wiring supplied with the high power supply potential Vdd is at the high power supply potential Vdd. Further, the transistor control signal Vtr is the L signal and the transistor 104 is off.

Further, in the period T4, the transistor 104 is off. In the integrator circuit of this embodiment, the transistor 104 which has small off-state current is used. Therefore, electric discharge can be prevented, and thus a voltage which is held in both the electrodes of the capacitor 103 (Vckp−Vref) can be held.

Note that the potential of the node Cin is equal to the potential of the input signal Vin in the period T4. Accordingly, the potential of the node Cin remains at the ground potential GND as shown in FIG. 5. Further, the potential of the node Cout remains at (Vckp−Vref) held in the period T3.

After the period T4 shown in the FIG. 5, the operation in the period T1 that is the normal operation is performed again. At this time, the transistor 104 is turned on. In the integrator circuit of this embodiment, the transistor 104 having extremely small off-state current is used. Therefore, discharge of electric charge can be prevented, and additional charge of the capacitor 103 can be performed quickly. Further, time required for charging the capacitor 103 can be shortened. Moreover, the integrator circuit 100 can output the output signal Vout having a waveform obtained by integrating the H signal or the L signal of the input signal Vin.

This is the description of the operations of the integrator circuit 100 illustrated in FIG. 1

As described above, in the integrator circuit of this embodiment, discharge of electric charge at the time of stopping supply of the power supply voltage can be prevented using a transistor with small off-state current, and thus a capacitor can be charged quickly at the time when supply of the power supply voltage is restarted. Accordingly, in one embodiment of the present invention, in the case where supply of the power supply voltage is stopped and restarted, electric discharge from the capacitor can be reduced, so that time required for charging the capacitor can be shortened.

This embodiment can be implemented by being combined with any of the other embodiments as appropriate.

(Embodiment 2)

In this embodiment, a modified example of the integrator circuit 100 described above in Embodiment 1 will be described.

Figure 6:
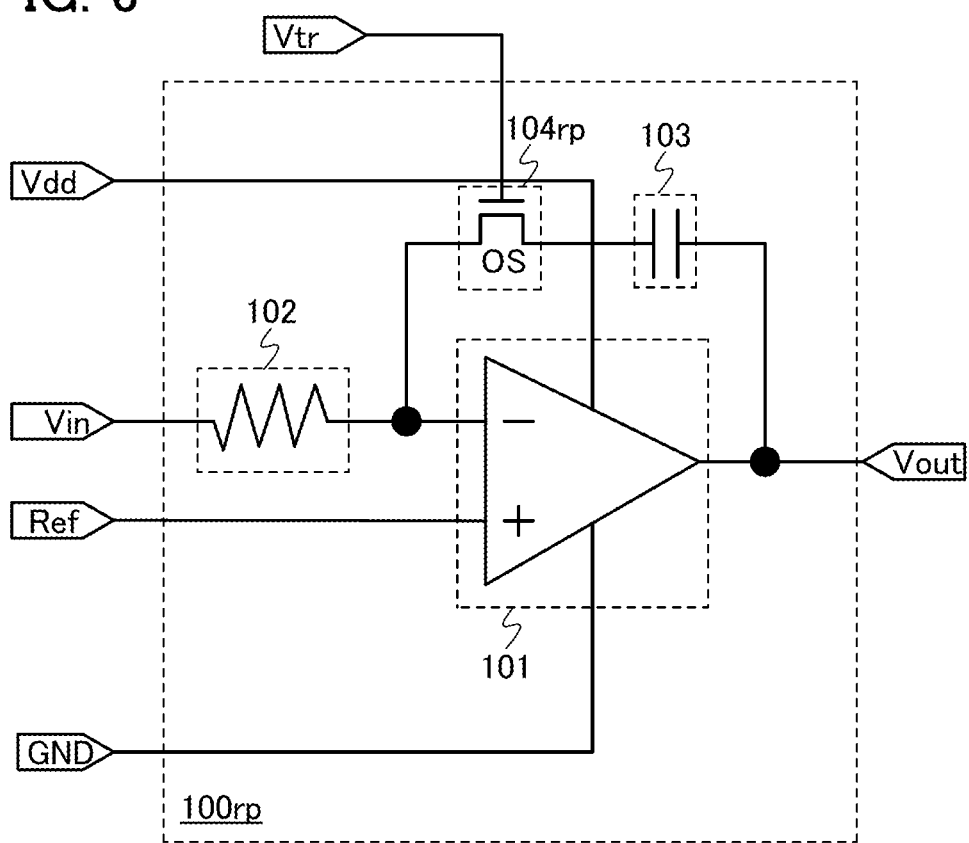
FIG. 6 is a circuit diagram of an integrator circuit.

An integrator circuit 100rp illustrated in FIG. 6 includes the differential amplifier circuit 101, the resistor 102, the capacitor 103, and a transistor 104rp.

The structure in FIG. 6 is obtained by placing the transistor 104rp on the one electrode side of the capacitor 103 instead of placing the transistor 104 on the other electrode side of the capacitor 103 in FIG. 1 of Embodiment 1. When the transistor 104rp is placed on the inverting input terminal side of the differential amplifier circuit 101 instead of being placed on the output terminal side of the differential amplifier circuit 101, parasitic capacitance due to the transistor on the output terminal side can be reduced.

Figure 10A:
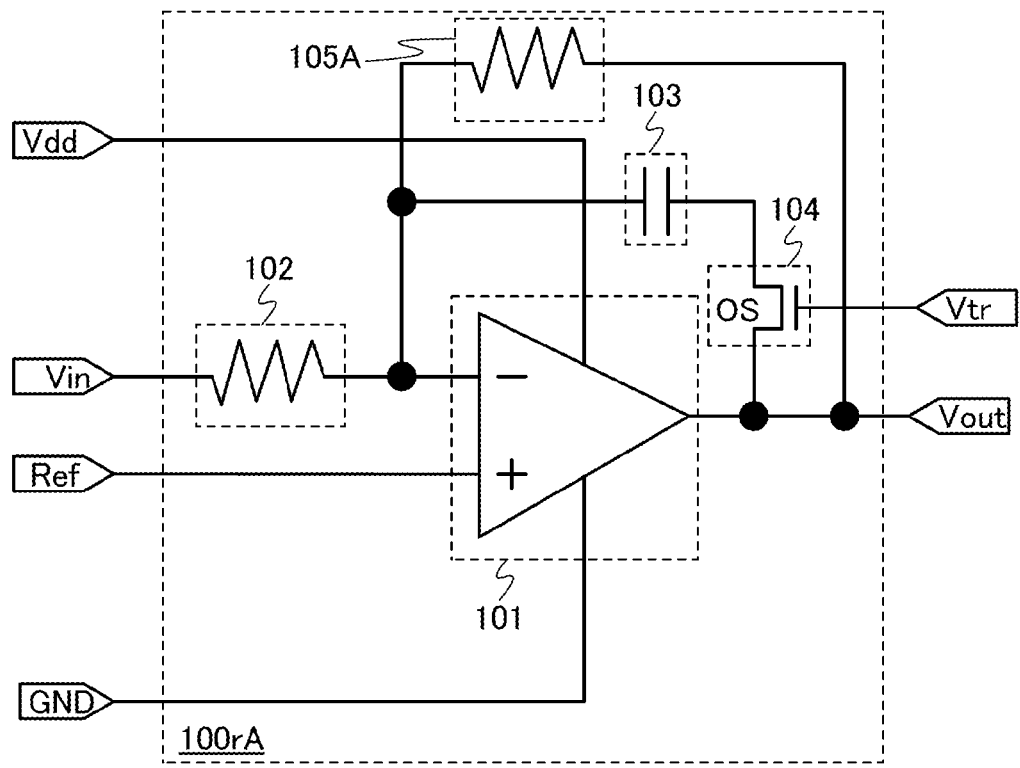
FIGS. 10A and 10B are each a circuit diagram of an integrator circuit.

An integrator circuit 100rA illustrated in FIG. 10A includes the differential amplifier circuit 101, the resistor 102, the capacitor 103, the transistor 104, and a resistor 105A.

The resistor 105A is provided to be electrically connected in parallel to the capacitor 103 and the transistor 104 in FIG. 1 of Embodiment 1. When the resistor 105A is provided to be electrically connected in parallel to the capacitor 103 and the transistor 104, saturation of electric charge in the capacitor 103 can be prevented.

Figure 10B:
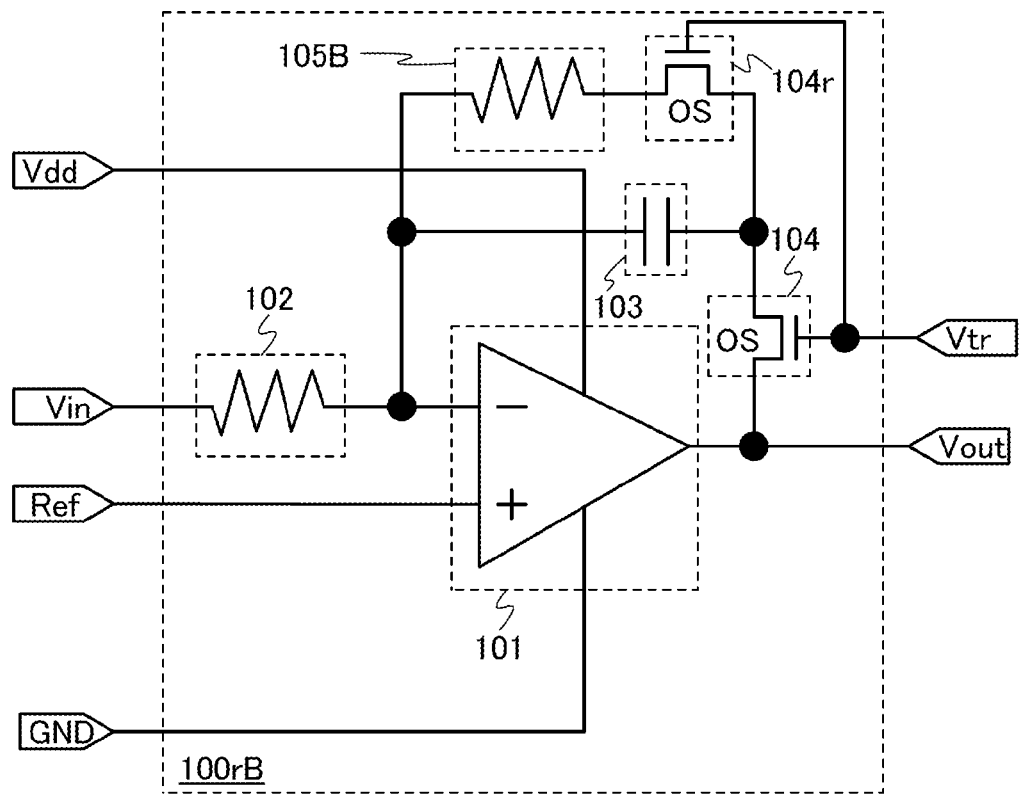

An integrator circuit 100rB illustrated in FIG. 10B includes the differential amplifier circuit 101, the resistor 102, the capacitor 103, the transistor 104, a transistor 104r, and a resistor 105B.

The transistor 104r and the resistor 105B are provided to be connected in parallel to the capacitor 103 in FIG. 1 of Embodiment 1. When the transistor 104r and the resistor 105B are provided to be electrically connected in parallel to the capacitor 103, an integral value obtained can be held at the time of turning off the transistor 104r and the transistor 104 and saturation of electric charge in the capacitor 103 can be prevented at the time of turning on the transistor 104r and the transistor 104.

This embodiment can be implemented by being combined with any of the other embodiments as appropriate.

(Embodiment 3)

In this embodiment, a modified example of the integrator circuit 100 described above in Embodiment 1 is described.

Figure 7:
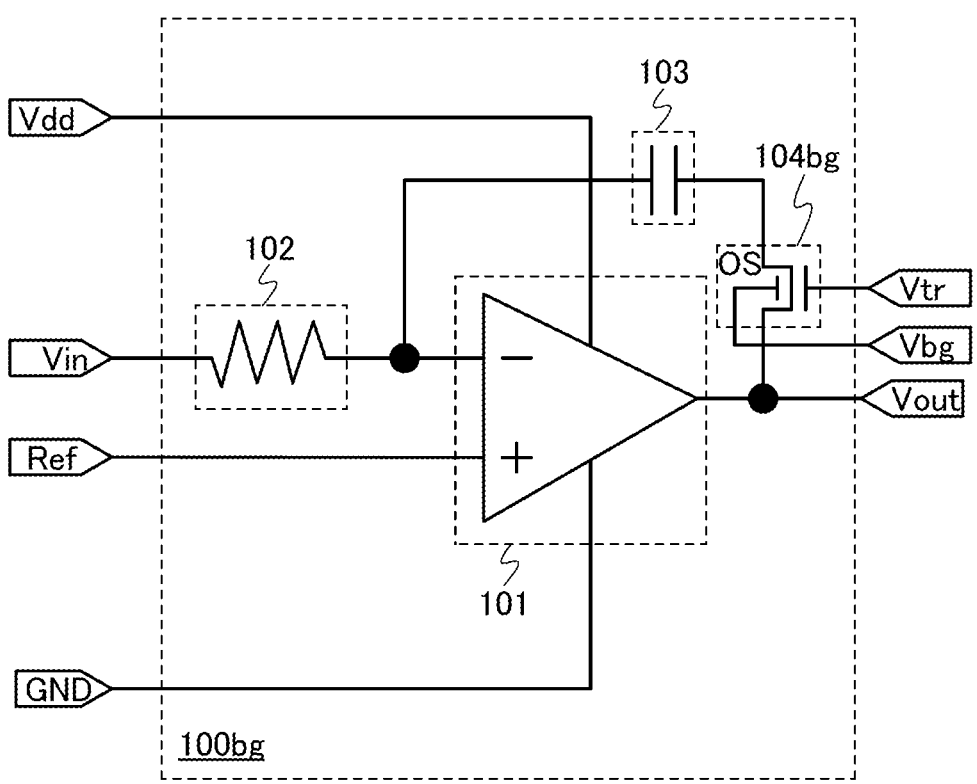
FIG. 7 is a circuit diagram of an integrator circuit.

An integrator circuit 100bg illustrated in FIG. 7 includes the differential amplifier circuit 101, the resistor 102, the capacitor 103, and a transistor 104bg.

In the structure in FIG. 7, the transistor 104bg including a back gate is used instead of the transistor 104 illustrated in FIG. 1 of Embodiment 1 and a back gate voltage Vbg for controlling a threshold voltage is input to the back gate of the transistor 104bg.

The structure in which the threshold voltage of the transistor 104bg is controlled by controlling the potential of the back gate voltage Vbg enables the integrator circuit 100bg illustrated in FIG. 7 to more surely perform operation such as holding of electric charge in the capacitor 103.

Figure 11:
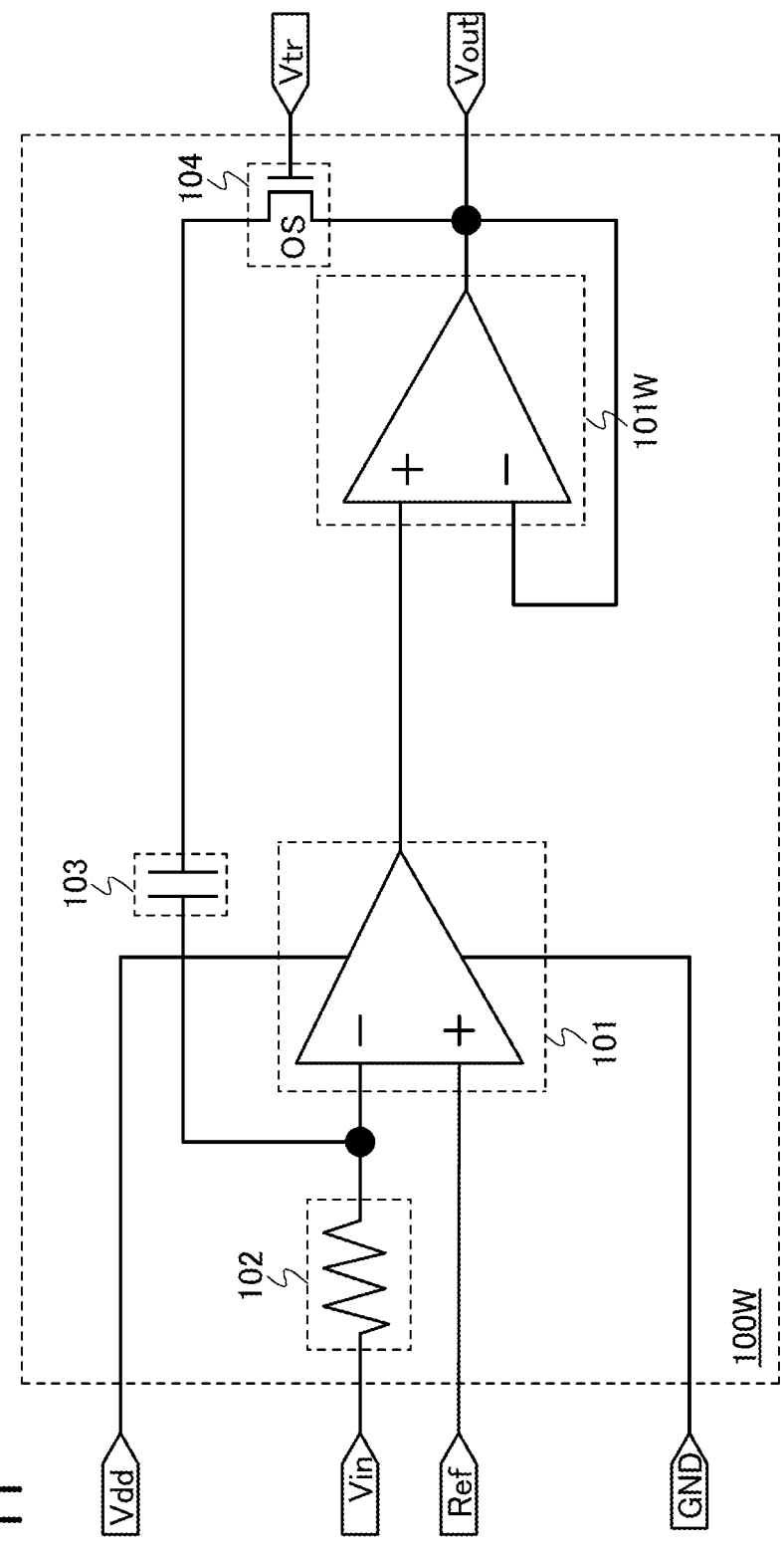
FIG. 11 is a circuit diagram of an integrator circuit.

An integrator circuit 100W illustrated in FIG. 11 includes the differential amplifier circuit 101, a differential amplifier circuit 101W, the resistor 102, the capacitor 103, and the transistor 104.

As illustrated in FIG. 11, a two-stage differential amplifier circuit in which the differential amplifier circuit 101W is connected to the differential amplifier circuit 101 in series can be employed. Such a structure enables the integrator circuit 100W to be an integrator circuit in which the differential amplifier circuit 101 is less influenced by noise.

This embodiment can be implemented by being combined with any of the other embodiments as appropriate.

(Embodiment 4)

In this embodiment, any of the integrator circuits described in Embodiments 1 to 3 is provided in an active loop filter included in a phase locked loop circuit (hereinafter referred to as a PLL circuit).

Figure 8:
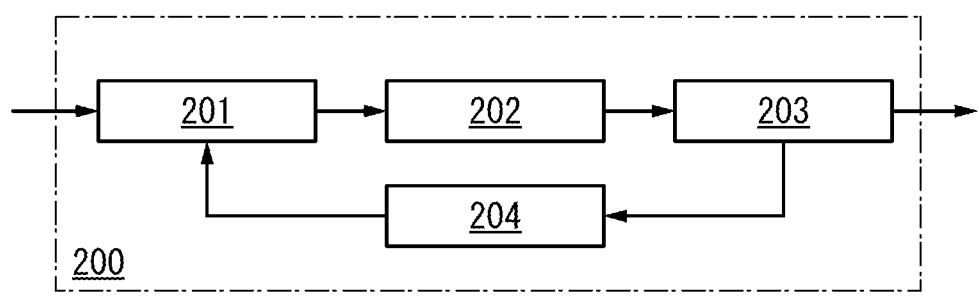
FIG. 8 is a block diagram of a PLL circuit.

A PLL circuit 200 illustrated in FIG. 8 includes a phase comparator 201, an active loop filter 202, a voltage controlled oscillator (also referred to as a VCO) 203, and a divider 204.

The use of any of the integrator circuits in the above embodiments for the active loop filter 202 can prevent electric discharge at the time of stopping supply of power supply voltage and enables quick charge of a capacitor at the time of restarting supply of the power supply voltage. Therefore, in one embodiment of the present invention, when supply of the power supply voltage to the PLL circuit is stopped and restarted, electric discharge from the capacitor can be reduced, so that time required for charging the capacitor can be shortened.

This embodiment can be implemented by being combined with any of the other embodiments as appropriate.

(Embodiment 5)

Figure 9:
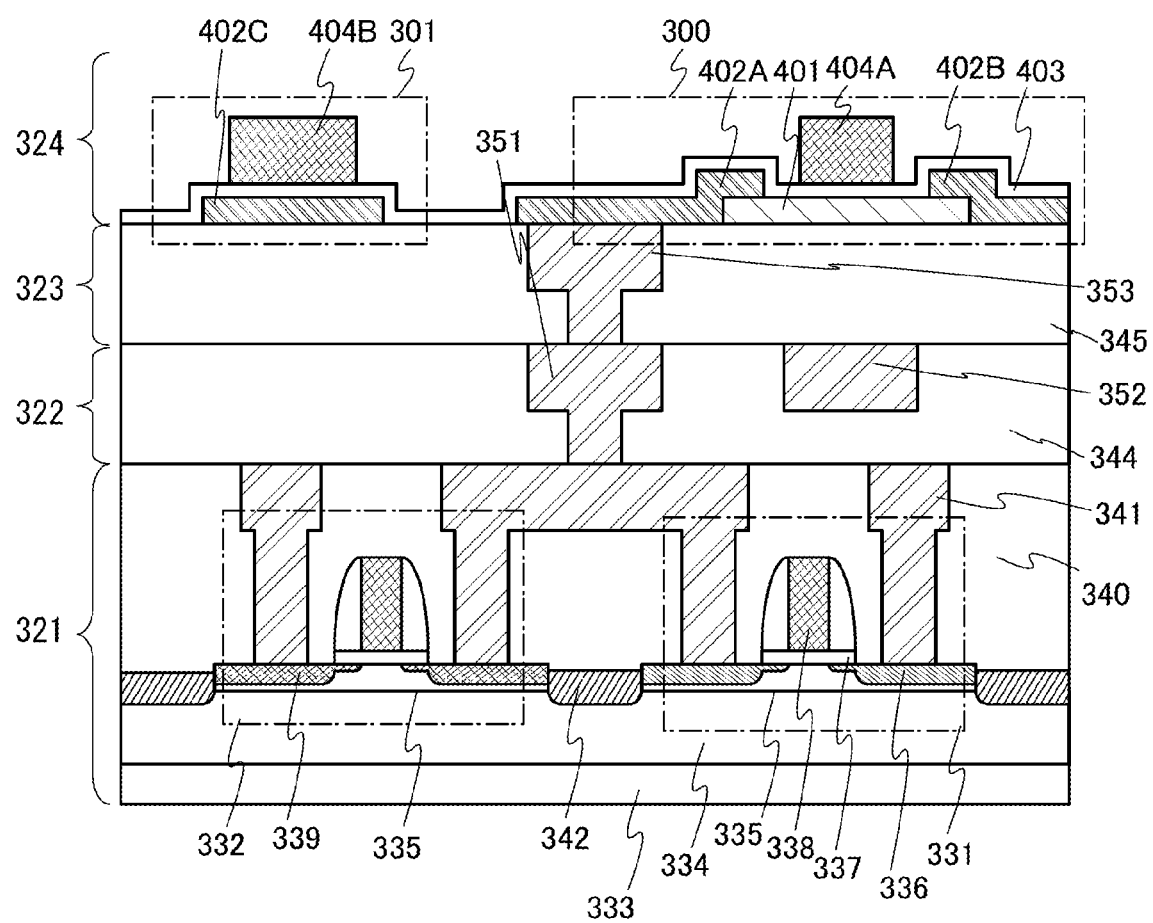
FIG. 9 is a cross-sectional view of transistors included in a semiconductor device.

In this embodiment, a cross-sectional structure of a semiconductor device in which the transistors included in the differential amplifier circuit described in any of Embodiments 1 to 3 and a transistor which is electrically connected to a capacitor in series are stacked is illustrated in FIG. 9 to be described.

In the structure of the cross-sectional view of the semiconductor device illustrated in FIG. 9, an n-channel transistor 331 and a p-channel transistor 332 as an example of transistors included in a differential amplification circuit are included in a lower layer portion; and a transistor 300 in which a channel is formed in an oxide semiconductor layer as a transistor included in an upper portion and a capacitor 301 are included.

The semiconductor device illustrated in FIG. 9 includes a lower element layer 321 including the n-channel transistor 331 and the p-channel transistor 332 in which a channel region is formed using a silicon material, and an upper element layer 324 including the transistor 104$bg$ and the capacitor 103 described in FIG. 7, which is electrically connected to the lower element layer 321 with a wiring layer 322 and a wiring layer 323 provided therebetween.

The n-channel transistor 331 in FIG. 9 includes an SOI layer 335 provided over a substrate 333 including a semiconductor material (e.g., silicon) with a BOX (buried oxide) layer 334 provided therebetween, n-type impurity regions 336 formed in the SOI layer 335, a gate insulating film 337, and a gate electrode 338. Although not illustrated, the SOI layer 335 includes intermetallic compound regions and a channel formation region in addition to the n-type impurity regions 336. In the p-channel transistor 332, p-type impurity regions 339 are formed in the SOI layer 335.

An element isolation insulating layer 342 is provided between the SOI layers 335 of the n-channel transistor 331 and the p-channel transistor 332, and an insulating film 340 is provided to cover the n-channel transistor 331 and the p-channel transistor 332. Note that in the n-channel transistor 331 and the p-channel transistor 332, sidewalls are formed on side surfaces of the gate electrode 338 as illustrated in FIG. 9, and regions having different concentrations of impurities may be included in the n-type impurity regions 336 and the p-type impurity regions 339.

The insulating film 340 over the n-type impurity regions 336 and the p-type impurity regions 339 has openings, and wirings 341 are provided to fill the openings. In the wiring layer 322 over the insulating film 340 and the wirings 341, an insulating film 344 has openings, and a wiring 351 and a wiring 352 are provided to fill the openings. In the wiring layer 323 over the insulating film 344, the wiring 351, and the wiring 352, an insulating film 345 has an opening, and a wiring 353 is provided to fill the opening.

Note that the wirings 341 in the lower element layer 321, the wiring 351 and the wiring 352 in the wiring layer 322, and the wiring 353 in the wiring layer 323 may be formed by a dual damascene method. Further, a contact plug may be formed to connect different wiring layers.

The n-channel transistor 331 and the p-channel transistor 332 each of which includes the SOI layer 335 including a semiconductor material can be operated at high speed and can be reduced in size as compared to the transistor 300.

After a top surface of the wiring layer 323 is subjected to chemical mechanical polishing (CMP) treatment to expose a top surface of the wiring 353, the transistor 300 and the capacitor 301 are formed.

The transistor 300 over the insulating film 345 and the wiring 353 includes an oxide semiconductor film 401, a source electrode 402A, a drain electrode 402B, a gate insulating film 403, and a gate electrode 404A. The capacitor 301 over the insulating film 345 and the wiring 353 includes one electrode 402C, the gate insulating film 403, and the other electrode 404B.

The source electrode 402A, the drain electrode 402B, and the one electrode 402C can be formed in the same layer. Further, the gate electrode 404A and the other electrode 404B can be formed in the same layer. In addition, the wiring 352 can be used as a back gate electrode of the transistor 300.

As described above, in the semiconductor device in this embodiment, the transistors whose channel regions are formed using silicon and the transistor whose channel region is formed using the oxide semiconductor film can be stacked. As a result, a space for each element can be saved and thus the size of the semiconductor device can be reduced.

This embodiment can be implemented by being combined as appropriate with any of the other embodiments.

This application is based on Japanese Patent Application serial no. 2012-107343 filed with Japan Patent Office on May 9, 2012, the entire contents of which are hereby incorporated by reference.

What is claimed is:

1. A semiconductor device comprising:
    a differential amplifier circuit comprising an inverting input terminal, a non-inverting input terminal, and an output terminal;
    a first resistor electrically connected to the inverting input terminal;
    a first transistor comprising a first terminal, a second terminal, and a gate; and
    a capacitor comprising a first electrode and a second electrode;
    wherein the first terminal is electrically connected to one of the output terminal and the inverting input terminal,
    wherein the second terminal is electrically connected to the first electrode,
    wherein the second electrode is electrically connected to the other of the output terminal and the inverting input terminal, and
    wherein the first transistor comprises an oxide semiconductor layer comprising a channel formation region overlapping with the gate.

2. The semiconductor device according to claim 1,
    wherein the first terminal is electrically connected to the output terminal, and
    wherein the second electrode is electrically connected to the inverting input terminal 3. The semiconductor device according to claim 2, further comprising a second resistor comprising:
    a first end electrically connected to the inverting input terminal, the second electrode, and the first resistor; and
    a second end electrically connected to the output terminal and the first terminal 4. The semiconductor device according to claim 2, further comprising:
    a second resistor comprising a first end and a second end; and a second transistor comprising a first terminal, a second terminal, and a gate, wherein the gate of the first transistor is electrically connected to the gate of the second transistor, wherein the first terminal of the second transistor is electrically connected to the second terminal of the first transistor and the first electrode, wherein the second terminal of the second transistor is electrically connected to the first end, and wherein the second end is electrically connected to the inverting input terminal, the second electrode, and the first resistor.

5. The semiconductor device according to claim 1,
wherein the first terminal is electrically connected to the inverting input terminal, and
wherein the second electrode is electrically connected to the output terminal 6. The semiconductor device according to claim 1, wherein the differential amplifier circuit is an operational amplifier.

7. The semiconductor device according to claim 1, wherein the oxide semiconductor layer comprises indium and zinc.

8. The semiconductor device according to claim 7, wherein the oxide semiconductor layer further comprises gallium.

9. A semiconductor device comprising:
an integrator circuit comprising:
  a differential amplifier circuit comprising an inverting input terminal, a non-inverting input terminal, and an output terminal;
  a first resistor electrically connected to the inverting input terminal;
  a first transistor comprising a first terminal, a second terminal, and a gate; and
  a capacitor comprising a first electrode and a second electrode,
wherein the first terminal is electrically connected to the output terminal,
wherein the second terminal is electrically connected to the first electrode,
wherein the second electrode is electrically connected to the inverting input terminal and the first resistor, and
wherein the first transistor comprises an oxide semiconductor layer comprising a channel formation region overlapping with the gate.

10. The semiconductor device according to claim 9, wherein the differential amplifier circuit is an operational amplifier.

11. The semiconductor device according to claim 9, wherein the oxide semiconductor layer comprises indium and zinc.

12. The semiconductor device according to claim 11, wherein the oxide semiconductor layer further comprises gallium.

13. The semiconductor device according to claim 9, further comprising a second resistor comprising:
  a first end electrically connected to the inverting input terminal, the second electrode, and the first resistor; and
  a second end electrically connected to the output terminal and the first terminal.

14. The semiconductor device according to claim 9, further comprising:
  a second resistor comprising a first end and a second end; and
  a second transistor comprising a first terminal, a second terminal, and a gate,
wherein the gate of the first transistor is electrically connected to the gate of the second transistor,
wherein the first terminal of the second transistor is electrically connected to the second terminal of the first transistor and the first electrode,
wherein the second terminal of the second transistor is electrically connected to the first end, and
wherein the second end is electrically connected to the inverting input terminal, the second electrode, and the first resistor.

15. The semiconductor device according to claim 9,
wherein a phase locked loop circuit comprises:
  a phase comparator;
  an active loop filter comprising the integrator circuit;
  a voltage controlled oscillator; and
  a divider.

16. A semiconductor device comprising:
an integrator circuit comprising:
  a first differential amplifier circuit comprising an inverting input terminal, a non-inverting input terminal, and an output terminal;
  a second differential amplifier circuit comprising an inverting input terminal, a non-inverting input terminal, and an output terminal;
  a resistor electrically connected to the inverting input terminal of the first differential amplifier circuit;
  a transistor comprising a first terminal, a second terminal, and a gate; and
  a capacitor comprising a first electrode and a second electrode,
wherein the first terminal is electrically connected to the output terminal of the second differential amplifier circuit and the inverting input terminal of the second differential amplifier circuit,
wherein the second terminal is electrically connected to the first electrode,
wherein the second electrode is electrically connected to the inverting input terminal of the first differential amplifier circuit and the resistor,
wherein the output terminal of the first differential amplifier circuit is electrically connected to the non-inverting input terminal of the second differential amplifier circuit, and
wherein the transistor comprises an oxide semiconductor layer comprising a channel formation region overlapping with the gate.

17. The semiconductor device according to claim 16, wherein the first differential amplifier circuit and the second differential amplifier circuit are each an operational amplifier.

18. The semiconductor device according to claim 16, wherein the oxide semiconductor layer comprises indium and zinc.

19. The semiconductor device according to claim 18, wherein the oxide semiconductor layer further comprises gallium.

20. The semiconductor device according to claim 16,
wherein a phase locked loop circuit comprises:
  a phase comparator;
  an active loop filter comprising the integrator circuit;
  a voltage controlled oscillator; and
  a divider.

* * * * *

UNITED STATES PATENT AND TRADEMARK OFFICE
CERTIFICATE OF CORRECTION

| | | |
|---|---|---|
| PATENT NO. | : 9,041,442 B2 | Page 1 of 1 |
| APPLICATION NO. | : 13/888454 | |
| DATED | : May 26, 2015 | |
| INVENTOR(S) | : Yamamoto et al. | |

It is certified that error appears in the above-identified patent and that said Letters Patent is hereby corrected as shown below:

In the claims

Column 12, line 57, claim 2, after "terminal" insert --.--; and

Column 12, line 63, claim 3, after "terminal" insert --.--.

Signed and Sealed this
Ninth Day of February, 2016

Michelle K. Lee
*Director of the United States Patent and Trademark Office*